(12) United States Patent
Kurachi et al.

(10) Patent No.: US 10,964,879 B2
(45) Date of Patent: Mar. 30, 2021

(54) METHOD OF MANUFACTURING A DIELECTRIC DEVICE

(71) Applicant: TDK CORPORATION, Tokyo (JP)

(72) Inventors: Katsuyuki Kurachi, Tokyo (JP); Hitoshi Sakuma, Tokyo (JP); Yasuhiro Aida, Tokyo (JP); Kazuhiko Maejima, Tokyo (JP); Mayumi Nakajima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 493 days.

(21) Appl. No.: 15/800,873

(22) Filed: Nov. 1, 2017

(65) Prior Publication Data

US 2018/0076379 A1    Mar. 15, 2018

Related U.S. Application Data

(63) Continuation of application No. 13/487,530, filed on Jun. 4, 2012, now abandoned.

(51) Int. Cl.
| | |
|---|---|
| *H01L 41/08* | (2006.01) |
| *H01L 41/312* | (2013.01) |
| *H01L 41/047* | (2006.01) |
| *H01L 41/314* | (2013.01) |
| *H01L 41/29* | (2013.01) |

(Continued)

(52) U.S. Cl.
CPC ...... *H01L 41/0815* (2013.01); *H01L 41/0477* (2013.01); *H01L 41/29* (2013.01); *H01L 41/311* (2013.01); *H01L 41/312* (2013.01); *H01L 41/314* (2013.01); *H01L 41/35* (2013.01);

(Continued)

(58) Field of Classification Search
CPC . H01L 41/0477; H01L 41/0815; H01L 41/29; H01L 41/311; H01L 41/312; H01L 41/314; H01L 41/35; H01L 28/55; Y10T 29/42; C30B 23/02; C30B 23/025
See application file for complete search history.

(56) References Cited

U.S. PATENT DOCUMENTS

| | | | |
|---|---|---|---|
| 5,450,812 A | * | 9/1995 | McKee .................. C30B 23/02 117/84 |
| 5,458,986 A | | 10/1995 | Wilber et al. |

(Continued)

FOREIGN PATENT DOCUMENTS

| | | |
|---|---|---|
| CN | 1652458A A | 8/2005 |
| CN | 102097580 A | 6/2011 |

(Continued)

OTHER PUBLICATIONS

Sep. 9, 2014 Office Action issued in U.S. Appl. No. 13/487,563.

(Continued)

*Primary Examiner* — A. Dexter Tugbang
(74) *Attorney, Agent, or Firm* — Oliff PLC (57) ABSTRACT

A method of manufacturing a dielectric device includes epitaxially growing a metal film on a substrate, forming a dielectric film on the metal film such that the dielectric film has a preferentially oriented structure, forming a first electrode film having a non-oriented or amorphous structure on the dielectric film, removing the substrate and the metal film from the dielectric film or removing the substrate from the metal film, and forming a second electrode film having a non-oriented or amorphous structure on the dielectric film or the metal film.

19 Claims, 5 Drawing Sheets

(51) Int. Cl.
*H01L 41/35* (2013.01)
*H01L 41/311* (2013.01)
*C30B 23/02* (2006.01)
*H01L 49/02* (2006.01)

(52) U.S. Cl.
CPC .............. *C30B 23/02* (2013.01); *H01L 28/55* (2013.01); *Y10T 29/42* (2015.01)

(56) References Cited

U.S. PATENT DOCUMENTS

| | | | |
|---|---|---|---|
| 6,476,540 | B2 | 11/2002 | Takeuchi et al. |
| 6,965,190 | B2 | 11/2005 | Tanuma et al. |
| 7,187,253 | B2 | 3/2007 | Sano et al. |
| 7,213,322 | B2 | 5/2007 | Nakagawara et al. |
| 7,268,647 | B2 | 9/2007 | Sano et al. |
| 7,323,805 | B2 | 1/2008 | Sano et al. |
| 7,535,157 | B2 | 5/2009 | Saito |
| 7,901,800 | B2 | 3/2011 | Shibata et al. |
| 2005/0098816 | A1 | 5/2005 | Baniecki et al. |
| 2005/0184627 | A1 | 8/2005 | Sano et al. |
| 2006/0091494 | A1* | 5/2006 | Miyamoto ............... H01L 28/55 257/532 |
| 2006/0214542 | A1 | 9/2006 | Iwashita et al. |
| 2007/0188270 | A1 | 8/2007 | Ohara et al. |
| 2007/0284971 | A1 | 12/2007 | Sano et al. |
| 2008/0074005 | A1 | 3/2008 | Sano et al. |
| 2008/0248324 | A1 | 10/2008 | Murayama et al. |
| 2009/0033177 | A1 | 2/2009 | Itaya et al. |
| 2009/0075066 | A1 | 3/2009 | Shibata et al. |
| 2009/0311417 | A1* | 12/2009 | Masuda ............... H01L 41/1876 427/100 |
| 2010/0097723 | A1 | 4/2010 | Hata et al. |
| 2010/0117493 | A1 | 5/2010 | Hayashi et al. |
| 2011/0000060 | A1* | 1/2011 | Lee ....................... H01L 41/312 29/25.35 |
| 2011/0109701 | A1 | 5/2011 | Ohashi |
| 2011/0121690 | A1 | 5/2011 | Shibata et al. |
| 2012/0032300 | A1 | 2/2012 | Wang |
| 2014/0145557 | A1 | 5/2014 | Tanaka |

FOREIGN PATENT DOCUMENTS

| | | | |
|---|---|---|---|
| EP | 2086031 | A2 | 8/2009 |
| JP | H11-097755 | A | 4/1999 |
| JP | 2003-176176 | A | 6/2003 |
| JP | 2005-244184 | A | 9/2005 |
| JP | 2006-100622 | A | 4/2006 |
| JP | 2006-188414 | A | 7/2006 |
| JP | 2006-286911 | A | 10/2006 |
| JP | 2007-049302 | A | 2/2007 |
| JP | 2007-277606 | A | 10/2007 |
| JP | 4142128 | B2 | 8/2008 |
| JP | 2008-211385 | A | 9/2008 |
| JP | 2009-094449 | A | 4/2009 |
| JP | 2010-103194 | A | 5/2010 |
| JP | 2011071467 | A * | 4/2011 |
| WO | 2007/017974 | A1 | 2/2007 |

OTHER PUBLICATIONS

Yamadera, Hideya. "Measurement and Control of Thermal Stress in Thin Films". R&D Review of Toyota CRDL, vol. 34, No. 1, pp. 19-24, 1999.

May 14, 2013 Written Opinion of the International Searching Authority issued in International Application No. PCT/JP2013/063877.

May 14, 2013 International Search Report issued in International Application No. PCT/JP2013/063877.

U.S. Appl. No. 13/487,563, filed Jun. 4, 2012.

* cited by examiner

| | | | | | |
|---|---|---|---|---|---|
| $Li^+$ | -3.040 | $Nb^{3+}$ | -1.099 | $Ru^{2+}$ | +0.455 |
| $K^+$ | -2.925 | $Ta^{5+}$ | -0.810 | $Cu^+$ | +0.520 |
| $Rb^+$ | -2.924 | $Zn^{2+}$ | -0.763 | $Rh^+$ | +0.600 |
| $Ba^{2+}$ | -2.920 | $Cr^{3+}$ | -0.740 | $Hg^+$ | +0.796 |
| $Sr^{2+}$ | -2.890 | $Fe^{2+}$ | -0.440 | $Ag^+$ | +0.799 |
| $Ca^{2+}$ | -2.840 | $Cd^{2+}$ | -0.403 | $Hg^{2+}$ | +0.850 |
| $Na^+$ | -2.714 | $Co^{2+}$ | -0.277 | $Pd^{2+}$ | +0.915 |
| $Mg^{2+}$ | -2.356 | $Ni^{2+}$ | -0.257 | $Ir^{3+}$ | +1.156 |
| $Al^{3+}$ | -1.676 | $Sn^{2+}$ | -0.138 | $Pt^{2+}$ | +1.188 |
| $Ti^{2+}$ | -1.630 | $Pb^{2+}$ | -0.126 | $Au^{3+}$ | +1.520 |
| $Zr^{4+}$ | -1.550 | $H+$ | 0.000 | $Au^+$ | +1.830 |
| $Mn^{2+}$ | -1.180 | $Cu^{2+}$ | +0.337 | | |

UNIT:V

PRIOR ART

Fig.5

METHOD OF MANUFACTURING A DIELECTRIC DEVICE

This is a Continuation of application Ser. No. 13/487,530 filed Jun. 4, 2012. The disclosure of the prior application is hereby incorporated by reference herein in its entirety.

BACKGROUND OF THE INVENTION

Field of the Invention

The present invention relates to a dielectric device.

Related Background Art

There are conventionally known dielectric devices having a dielectric film and a pair of electrode films laid on both sides of the dielectric film, as disclosed in Patent Literatures 1 to 5.

Patent Literature 1: Japanese Patent Application Laid-open No. 2010-103194

Patent Literature 2: Japanese Patent Application Laid-open No. 2009-094449

Patent Literature 3: Japanese Patent Application Laid-open No. 2008-211385

Patent Literature 4: Japanese Patent Application Laid-open No. 2007-277606

Patent Literature 5: Japanese Patent Application Laid-open No. 2006-286911

SUMMARY OF THE INVENTION

In the case of the conventional dielectric devices, however, it is not easy to enhance the crystallinity of the dielectric and manufacturing cost thereof is also high. The present invention has been accomplished in view of these problems and provides a dielectric device capable of readily achieving improvement in crystallinity of the dielectric and lower cost.

A dielectric device according to the present invention comprises: a first electrode film having a non-oriented or amorphous structure; a dielectric film provided on the first electrode film and having a preferentially oriented structure; and a second electrode film provided on the dielectric film and having a non-oriented or amorphous structure.

In the present invention the "preferentially oriented structure" refers to a structure such that in the result of X-ray diffraction measurement, an intensity of a peak ascribed to a certain crystal lattice plane is not less than 50% of a total of intensities of all peaks. The "non-oriented structure" refers to a structure such that in X-ray diffraction measurement, an intensity of a peak ascribed to any crystal plane is less than 50% of a total of intensities of all peaks. The "amorphous structure" refers to a structure such that in X-ray diffraction measurement, no peak is observed to be ascribed to a crystal lattice plane.

In the present invention, the dielectric film is preferably (001), (101), or (110) preferentially oriented.

In the present invention the two electrode films can be composed of an elemental metal or can also be composed of an alloy containing two or more metals, and they may contain an element other than metals, without inhibiting the characteristics including electrical conductivity. The two electrode films can have their respective compositions different from each other, but they preferably have the same composition.

In the present invention the dielectric may be a piezoelectric material or may be a paraelectric, pyroelectric, or ferroelectric material. Among others, the piezoelectric material is preferable.

In the present invention, an oxidation-reduction potential of every metal element forming the first and second electrode films is preferably higher than that of every metal element forming the dielectric film. This makes the dielectric film chemically and electrically stable, without being reduced by the electrode films, thereby to further improve the lifetime and reliability of the dielectric device.

The first and second electrode films are preferably composed of a metal selected from Al, Ti, Zr, Ta, Cr, Co, and Ni or composed of an alloy containing metals selected therefrom. Particularly, in cases where the dielectric device has the dielectric film composed of only a metal element or metal elements having a sufficiently low oxidation-reduction potential, when the constituent elements of the two electrode films are selected from the aforementioned metal elements, interfaces between the electrode films and the dielectric film become chemically and electrically stable, thereby to further improve the lifetime and reliability of the dielectric device.

One principal surface of the dielectric film can be in contact with the first electrode film and the other principal surface of the dielectric film can be in contact with the second electrode film.

In the present invention, the dielectric device preferably further comprises an intermediate film composed of a metal selected from Al, Ti, Zr, Ta, Cr, Co, and Ni, between at least one electrode film and the dielectric film, for the purpose of improvement in adhesion between the two films. An oxidation-reduction potential of the metal forming this intermediate film is preferably lower than that of any one of metal elements forming the dielectric film.

The intermediate film can be in contact with the electrode film and the dielectric film.

It is believed that a requisite minimum oxidation-reduction reaction occurs between the intermediate film and the dielectric film, so as to improve adhesion between the films. However, if the oxidation-reduction reaction is promoted too much, a composition balance of the dielectric film will be lost, so as to cause degradation of the piezoelectric property and other properties in some cases; therefore, there is, naturally, an upper limit to the film thickness of the intermediate film.

When the dielectric device comprises the intermediate film, an electroconductive oxide film composed of an electroconductive oxide may be provided between the electrode film and the dielectric film, preferably between the intermediate film and the dielectric film, for the purpose of preventing characteristic degradation of this device. This configuration makes the dielectric film less likely to be reduced by the electrode film, thereby to further improve the device in degradation of characteristics.

The intermediate film or the electroconductive oxide film can be in contact with the dielectric film.

The dielectric device can further comprise a metal film having a preferentially oriented structure, between the second electrode film and the dielectric film, and the metal film can be in contact with the second electrode film and the dielectric film.

According to the present invention, the crystallinity of the dielectric film in the dielectric device can be readily improved and it becomes feasible to achieve replacement of materials of the two electrode films with inexpensive materials and increase in throughput of deposition process.

DESCRIPTION OF THE PREFERRED EMBODIMENTS

Embodiments of the present invention will be described below in detail with reference to the drawings.

(Dielectric Device 100A)

Figure 1A:
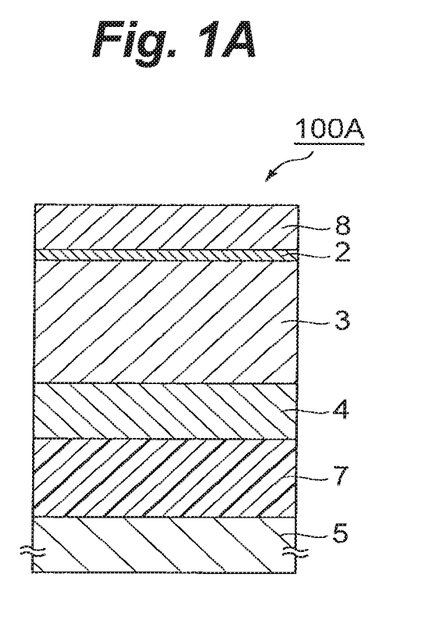
FIGS. 1A-1D are schematic sectional views of dielectric devices according to embodiments of the present invention.

A dielectric device 100A according to an embodiment of the present invention will be described with reference to FIG. 1A. The dielectric device 100A is disposed on a resin layer 7 which is laid on a support substrate 5, and has a first electrode film 4, a dielectric film 3, a metal film 2, and a second electrode film 8 in the order named.

(Dielectric Film 3)

The dielectric film 3 has a preferentially oriented structure. The "preferentially oriented structure" refers to a structure such that in the result of X-ray diffraction measurement, an intensity of a peak ascribed to a certain crystal lattice plane is not less than 50% of a total of intensities of all peaks. The dielectric film 3 is preferably one such that in the result of X-ray diffraction measurement, an intensity of a peak ascribed to a certain crystal lattice plane is not less than 80% of a total of intensities of all peaks.

The dielectric film 3 is preferably (001), (101), or (110) preferentially oriented. This configuration allows the dielectric film 3 to be a dielectric body with excellent characteristics.

When a piezoelectric film is used as the dielectric film 3, examples of piezoelectric film preferably applicable include films of KNN or equivalently (K,Na)NbO$_3$, LN or equivalently LiNbO$_3$, AlN, and so on. Other applicable materials for the dielectric film 3 include MgO, STO or equivalently SrTiO$_3$, BTO or equivalently BaTiO$_3$, and so on.

There are no particular restrictions on the thickness of the dielectric film 3, but the thickness is normally in the range of about 1000 nm to 4000 nm.

(Electrode Films 4, 8)

The first electrode film 4 is laid on a bottom surface of the dielectric film 3, while the second electrode film 8 is laid on a top surface of the dielectric film 3. Each of the first electrode film 4 and the second electrode film 8 has a non-oriented or amorphous structure. Both of the two electrode films may have the amorphous structure; or, both of the electrode films may have the non-oriented structure; or, one electrode film may have the non-oriented structure while the other electrode film has the amorphous structure.

The "non-oriented structure" refers to a structure such that in X-ray diffraction measurement, an intensity of a peak ascribed to any crystal plane is less than 50% of a total of intensities of all peaks. The electrode films 4, 8 are preferably those such that an intensity of a peak ascribed to a certain crystal lattice plane is not more than 10% of a total of intensities of all peaks. The "amorphous structure" refers to a structure such that in X-ray diffraction measurement no peak is observed to be attributed to a crystal lattice plane.

The electrode films 4, 8 are composed of a metal element or metal elements and there are no particular restrictions on the metal element or metal elements, which can be selected from a wide variety of elemental metals and alloys.

In terms of improvement in reliability to prevent degradation of characteristics due to the battery effect, however, an oxidation-reduction potential of every metal forming the electrode films 4, 8 is preferably higher than that of every metal element forming the dielectric film 3. When this condition is met, an oxidation-reduction reaction is remarkably suppressed between the dielectric film 3 and the electrode films 4, 8 to reduce time degradation of the dielectric film 3 due to the battery effect, so as to enhance the reliability of the device. The material of each of the electrode films 4, 8 preferably has a melting point sufficiently higher than heat loads applied in subsequent processes.

For example, when the dielectric film 3 is composed of barium titanate, the electrode films 4, 8 to be employed are preferably films composed of a metal selected from Zr, Ta, Cr, Fe, Co, Ni, and Cu having the oxidation-reduction potentials higher than that of Ti (oxidation-reduction potential: −1.63 V or higher), or films composed of any one of alloys of these metals.

For example, when the dielectric film 3 is composed of potassium sodium niobate (KNN), the electrode films 4, 8 to be employed are preferably films composed of a metal selected from Ta, Cr, Fe, Co, Ni, and Cu having the oxidation-reduction potentials higher than that of Nb (oxidation-reduction potential: −1.099 V), or films composed of any one of alloys of these metals.

When the dielectric film 3 is composed of magnesium oxide, the metal films to be used are preferably films composed of a metal selected from Al, Ti, Zr, Ta, Cr, Fe, Co, Ni, and Cu having the oxidation-reduction potentials higher than that of Mg (oxidation-reduction potential: −2.356 V), or films composed of any one of alloys of these metals; particularly, it is possible to adopt even Al and Ti.

When the dielectric film 3 is composed of PZT (lead zirconate titanate), the material to be selected can be an electrode material (e.g., Cu or the like) having the oxidation-reduction potential higher than that of Pb (oxidation-reduction potential: −1.126 V).

As described above, the material of the electrode films 4, 8 to be employed can be any one of materials with a relatively low melting point other than Pt, Ir, Pd, and Rh having high melting points.

Examples of alloy materials to be used for the electrode films 4, 8 include Al—Cu alloys, Ti—Al—Cr alloys, and Ni—Cr alloys and it is particularly preferable to use one of the Al—Cu alloys, for the reasons of low electric resistance and low power consumption.

The electrode film materials of the electrode films 4, 8 are preferably the same material. Since the materials of the electrode films 4, 8 can be selected from the wide selection range of metals or alloys, inexpensive materials can also be used as long as the conditions including the resistance to process temperatures are satisfied.

There are no particular restrictions on the thicknesses of the electrode films 4, 8, but they can be determined in the range of 100 nm to 200 nm.

(Metal Film 2)

The metal film 2 is provided between the second electrode film 8 and the dielectric film 3 and the metal film 2 is in contact with the dielectric film 3 and the second electrode film 8. The metal film 2 has a preferentially oriented structure; that is, the metal film 2 has a structure such that in X-ray diffraction measurement, an intensity of a peak ascribed to a certain crystal lattice plane is not less than 50% of a total of intensities of all peaks. The metal film 2 is preferably one such that in X-ray diffraction measurement, an intensity of a peak ascribed to a certain crystal lattice plane is not less than 80% of a total of intensities of all peaks. The thickness of the metal film 2 is selected so as to enhance the crystallinity of the dielectric film 3 epitaxially grown in contact with the metal film 2.

Figure 5:
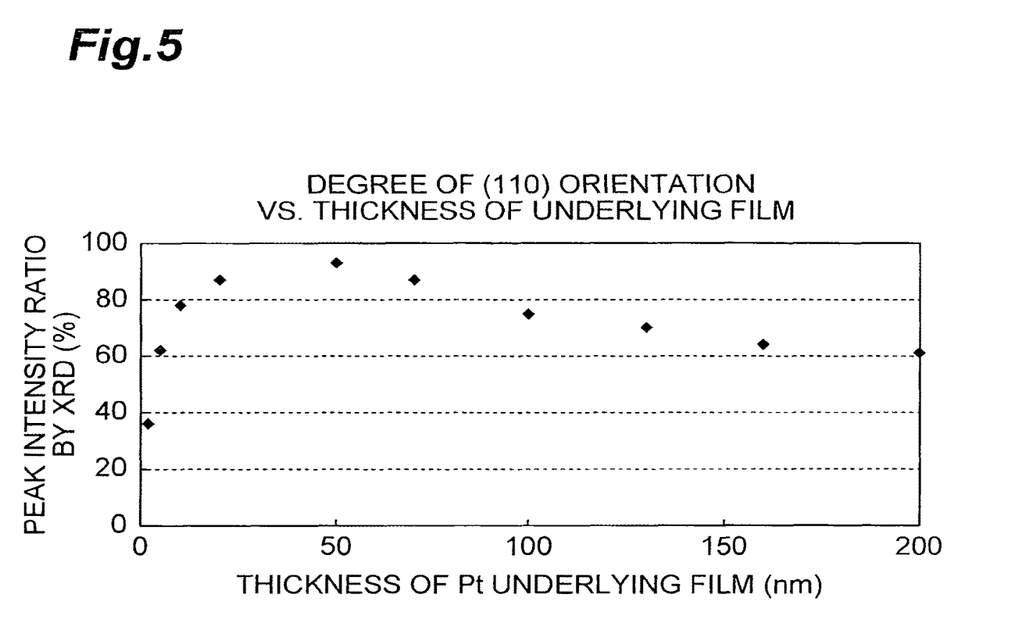
FIG. 5 is a drawing showing a relation of thickness of underlying Pt film versus degree of orientation of dielectric film.

For example, when the dielectric film 3 is a piezoelectric film, the thickness of the metal film 2 is preferably in the range of 20 nm to 70 nm (cf. FIG. 5). In this small thickness range, it is difficult for the metal film 2 alone to function as a lower electrode film of the dielectric device 100A. A metal forming the metal film 2 can be selected from metals (including alloys) having the a-axis lattice constant smaller than that of the dielectric film 3 and having thermal resistance to temperature during deposition of the dielectric film, and it is preferable to select Pt or Rh.

There is the metal film 2 remaining between the dielectric film 3 and the electrode film 8, while there is no other film between the dielectric film 3 and the electrode film 4.

(Dielectric Device 100B)

Figure 1B:
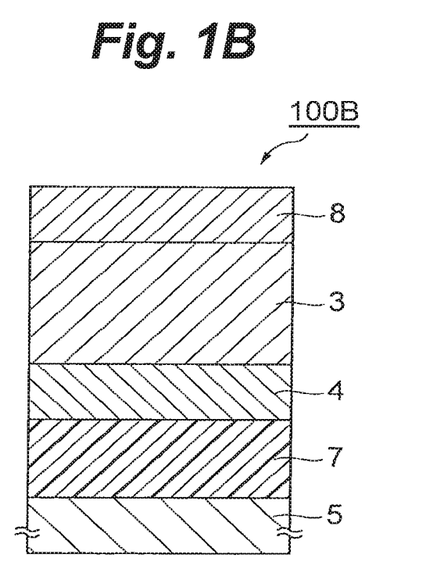

A dielectric device 100B according to an embodiment of the present invention will be described with reference to FIG. 1B. This dielectric device 100B is different from the dielectric device 100A in that the dielectric device 100B does not have the metal film 2 and therefore the electrode film 8 and the dielectric film 3 are in direct contact. Furthermore, there is no other film between the dielectric film 3 and the electrode film 4, as in the first embodiment.

(Dielectric Device 100C)

Figure 1C:
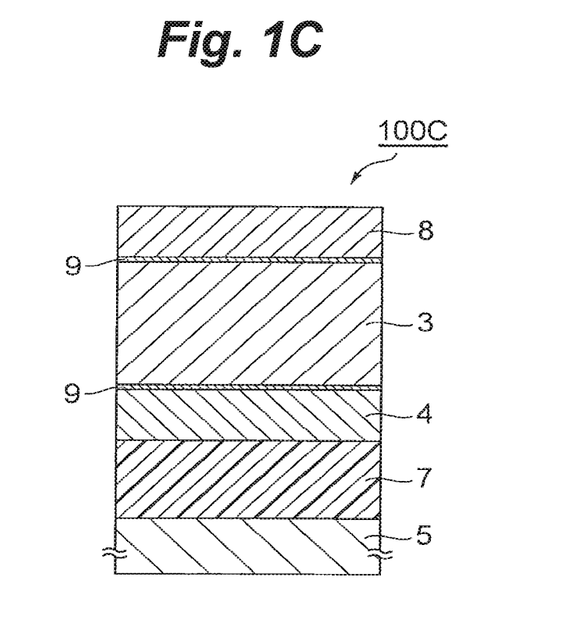

A dielectric device 100C according to an embodiment of the present invention will be described with reference to FIG. 1C. This dielectric device 100C is different from the dielectric device 100B in that intermediate films 9 composed of a metal having the oxidation-reduction potential lower than that of any one of metal elements forming the dielectric film 3 are provided, one between the electrode film 8 and the dielectric film 3 and the other between the electrode film 4 and the dielectric film 3.

For example, when the dielectric film 3 is potassium sodium niobate: $(K,Na)NbO_3$, a standard is Nb (oxidation-reduction potential: $-1.099$ V) having the highest oxidation-reduction potential among the three elements except for oxygen. As described above, it is preferable to use as the electrode films 8, 4, metal films composed of Cr (oxidation-reduction potential: $-0.74$ V) and/or Ni (oxidation-reduction potential: $-0.257$ V) having the oxidation-reduction potential higher than Nb. Then, metal films composed of Ti (oxidation-reduction potential: $-1.63$ V) having the oxidation-reduction potential lower than Nb can be used as the intermediate films 9.

When the dielectric film 3 is magnesium oxide, a standard is Mg (oxidation-reduction potential: $-2.356$ V). As described previously, it is preferable to use as the electrode films 4, 8, metal films composed of Al (oxidation-reduction potential: $-1.676$ V) and/or Ti (oxidation-reduction potential: $-1.63$ V). Metal films composed of Sr (oxidation-reduction potential: $-2.89$ V) can be used as the intermediate films 9.

The intermediate films 9 are preferably composed of any element selected from Al, Ti, Zr, Ta, Cr, Co, and Ni.

The thicknesses of the intermediate films 9 are preferably in the range of 2 nm to 5 nm, from the viewpoint of minimizing the oxidation-reduction reaction with the dielectric film 3 while enhancing the adhesion strength between the dielectric film 3 and the electrode films 4, 8. The film thicknesses of more than 5 nm can degrade the characteristics of the dielectric film, and the thicknesses of less than 2 nm can lead to insufficient function as an adhesion layer. The intermediate films 9 may have a preferentially oriented structure or may have a non-oriented or amorphous structure, but they preferably have the non-oriented or amorphous structure. The preferentially oriented, non-oriented, and amorphous structures all are as described above. The intermediate films 9 are preferably those such that in X-ray diffraction measurement, an intensity of a peak ascribed to any crystal plane is not more than 10% of a total of intensities of all peaks.

For example, when the dielectric film 3 is composed of potassium sodium niobate and when the intermediate films 9 are composed of Ti, the surfaces of the dielectric film 3 can be reduced because the oxidation-reduction potential of Ti: $-1.63$ V is lower than that of Nb: $-1.099$ V. Therefore, the thicknesses of the intermediate films 9 are preferably not too large while being enough to enhance adhesion.

Even if the metal element forming the electrode films 4, 8 has the oxidation-reduction potential higher than every metal element forming the dielectric film 3, the presence of the intermediate films 9 makes it easier to improve the adhesion strength between the two electrode films 4, 8 and the dielectric film 3.

(Dielectric Device 100D)

Figure 1D:
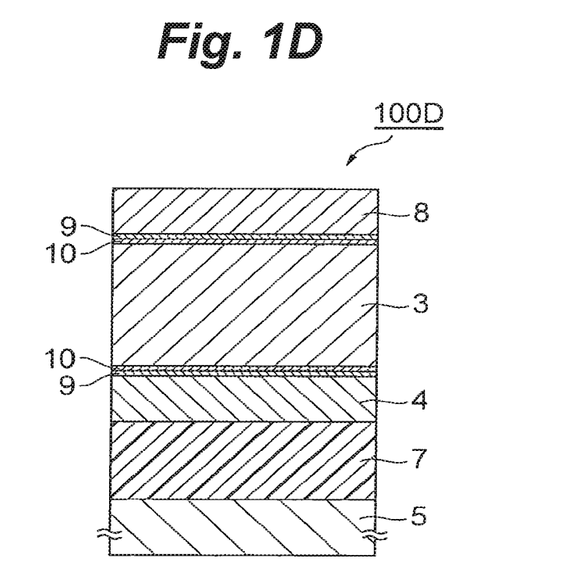
Figure 2:
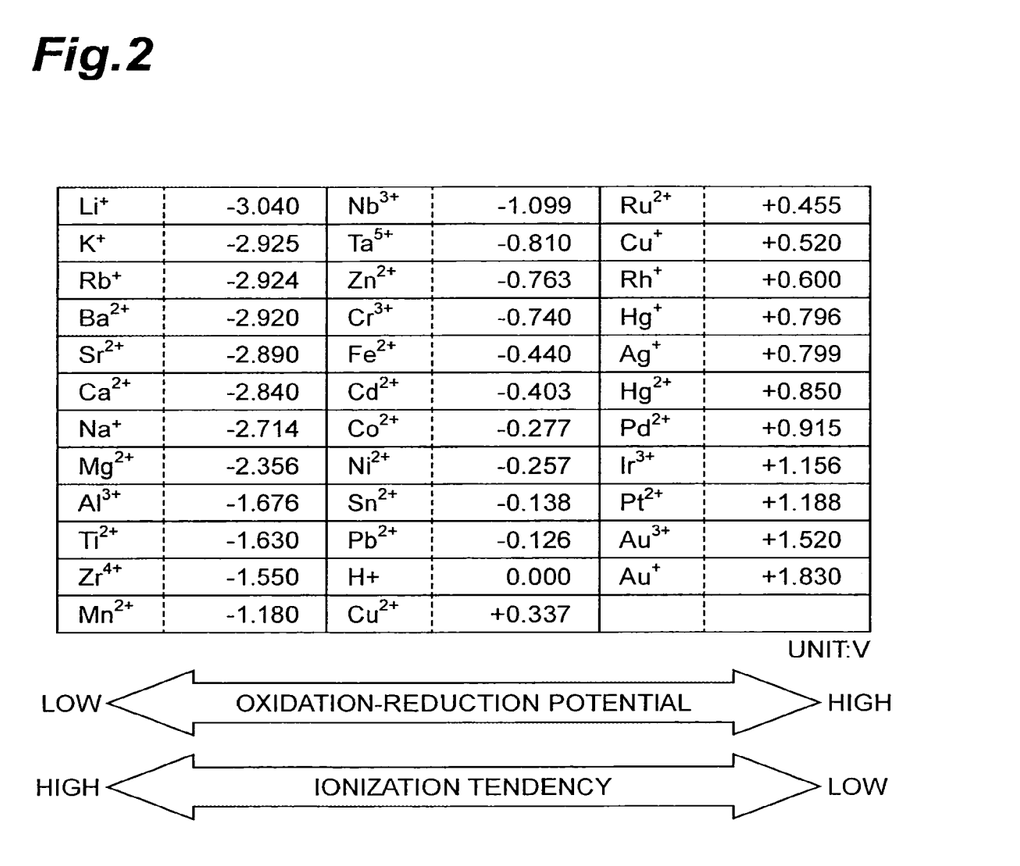
FIG. 2 is a table showing oxidation-reduction potentials of metals.

A dielectric device 100D according to an embodiment of the present invention will be described with reference to FIG. 1D. This dielectric device 100D is different from the dielectric device 100C in that electroconductive oxide films 10 are provided respectively between the dielectric film 3 and the intermediate films 9. It is also possible to employ a single electroconductive oxide film 10, and it can be located anywhere between the electrode film 4, 8 and the dielectric film 3.

The electroconductive oxide films 10 provide an effect to suppress the oxidation-reduction reaction between the intermediate films 9 and the dielectric film 3. The electroconductive oxide is preferably an oxide containing one metal element having the oxidation-reduction potential higher than every metal element forming the dielectric film 3 and containing a metal element having the oxidation-reduction potential lower than the metal element forming the intermediate films 9. Examples of such electroconductive oxides include SRO ($SrRuO_3$), ITO ($In_2O_3$—$SnO_2$), and so on.

The thicknesses of the electroconductive oxide films 10 are, for example, in the range of about 5 nm to 20 nm. The electroconductive oxide films 10 can be formed, for example, by sputtering.

The electroconductive oxide films 10 may have a preferentially oriented structure or may have a non-oriented or amorphous structure, but they preferably have the non-oriented or amorphous structure. The preferentially oriented, non-oriented, and amorphous structures all are as described above. The electroconductive oxide films 10 are preferably those such that in X-ray diffraction measurement, an intensity of a peak ascribed to any crystal plane is not more than 10% of a total of intensities of all peaks.

In the dielectric devices 100B-100D, the two principal surfaces of the dielectric film 3 both are in contact with the film having the non-oriented or amorphous structure, and an underlying film, which was used in epitaxial growth of the dielectric film 3, is removed.

(Methods for Manufacturing Dielectric Devices)

Methods for manufacturing the above-described dielectric devices 100A-100D will be described below with reference to FIGS. 3A-3G.

Figure 3A:
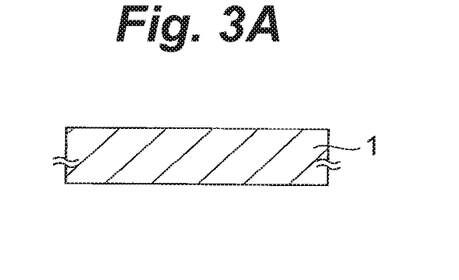
FIGS. 3A-3G are schematic sectional views showing methods for manufacturing the dielectric devices in FIGS. 1A-1D.

First, a substrate 1 is prepared, as shown in FIG. 3A. Examples of substrate 1 are substrates of single-crystal Si, sapphire, magnesium oxide, and so on, and a single-crystal Si substrate is suitably applicable, particularly, in the case where a piezoelectric film of PZT or the like is formed thereon.

Figure 3B:
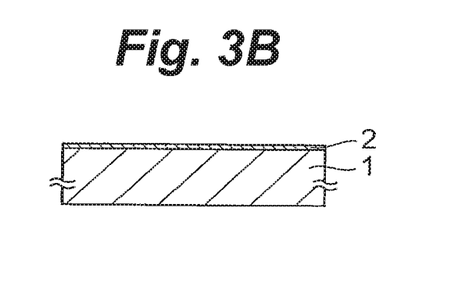

Next, as shown in FIG. 3B, a metal film 2 with a preferentially oriented structure to serve as an underlying film for dielectric film 3 is formed on the substrate 1. The metal film 2 is obtained, for example, by evaporation, sputtering, or the like in such a manner that a metal material is epitaxially grown on the substrate 1, under the condition that the substrate 1 is kept at high temperature. For example, when the metal material is sputtered in a state in which the Si substrate 1 is heated at about 400-600° C., the metal film 2 having structure corresponding to the surface orientation of the Si substrate 1 can be obtained.

Figure 3C:
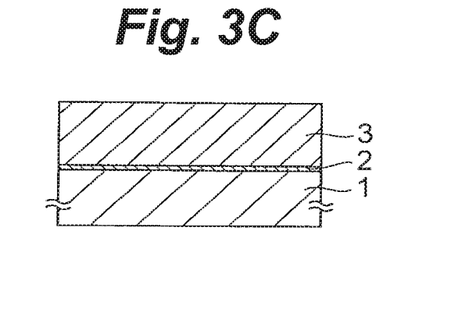

Next, as shown in FIG. 3C, a dielectric film 3 having a preferentially oriented structure is formed on the metal film 2. The dielectric film 3 can be obtained by sputtering or the like in such a manner that a dielectric material is epitaxially grown on the underlying layer, under the condition that the underlying layer, i.e., the substrate 1 and metal film 2, is kept at high temperature. The Si substrate 1 and metal film 2 are preferably heated at about 400-600° C.

Figure 3D:
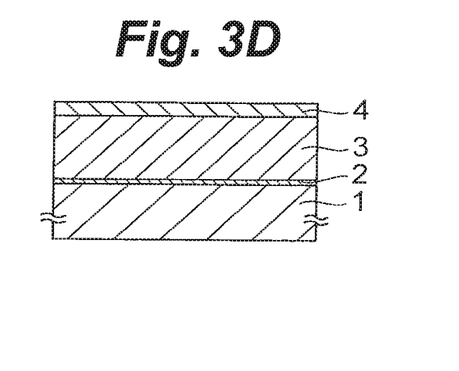

Next, as shown in FIG. 3D, an electrode film 4 having a non-oriented or amorphous structure is formed on the dielectric film 3.

The electrode film 4 is obtained by depositing a metal material on the dielectric film 3, without epitaxial growth. Specifically, it may be deposited at low temperature by sputtering, evaporation, or the like. It can be formed at a high deposition rate in a short time. The substrate 1 and the dielectric film 3 are preferably kept at a temperature in the range of room temperature to 200° C.

Figure 3E:
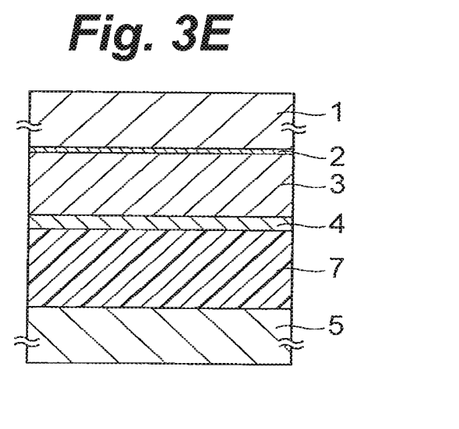

Next, as shown in FIG. 3E, after the deposition of the electrode film 4, the electrode film 4 is bonded to a support substrate 5 by resin layer 7.

An example of the support substrate 5 is a polycrystalline silicon substrate. Examples of the resin layer 7 include epoxy resin and silicone resin, and the epoxy resin is preferably applicable, particularly, in terms of rigidity. The bonding may be implemented, for example, by a method of applying an adhesive in the thickness of about 2000-5000 nm onto the support substrate 5 and the electrode film 4 by spin coating and then stacking and bonding them in vacuum.

Figure 3F:
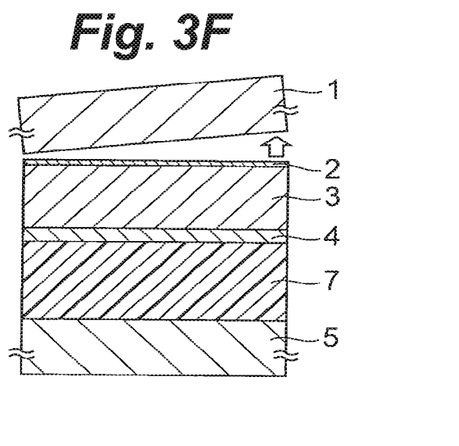

Next, as shown in FIG. 3F, the substrate 1 is removed from the metal film 2. The removal of the substrate 1 can be implemented by a method such as CMP (chemical mechanical polishing) or RIE (reactive ion etching). After the substrate 1 is removed, the metal film 2, which was the underlying film for the dielectric film 3, is exposed as the outermost surface.

Figure 3G:
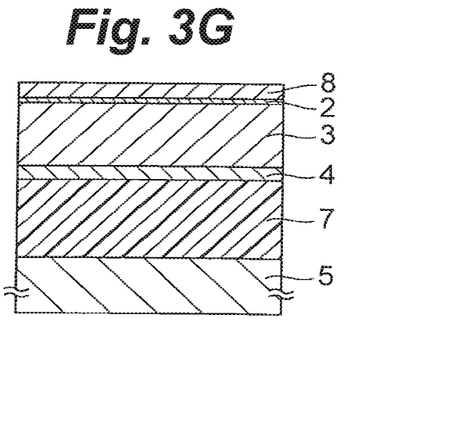

Subsequently, as shown in FIG. 3G, an electrode film 8 having a non-oriented or amorphous structure is formed on the metal film 2. The electrode film 8 may be formed by the same method as the electrode film 4. This completes the dielectric device 100A having the electrode films 4, 8 and the dielectric film 3.

If necessary, the dielectric device 100A can be patterned on the support substrate 5. If necessary, a protecting film to protect the dielectric device 100A may be formed. Furthermore, if necessary, the dielectric device 100A can be singulated, or, it may be singulated after the dielectric device 10A is separated from the support substrate 5; or, it may be singulated by cutting the dielectric device 100A together with the support substrate 5.

The dielectric device 100A with the electrode films 4, 8 above and below the dielectric film 3 can be obtained in the manner as described above.

The dielectric device 100B can be manufactured by also removing the metal film 2 as well as the substrate 1, in FIG. 3F.

The dielectric device 100C can be manufactured by forming the intermediate film 9, before the formation of each of the electrode films 4, 8 in the process of the dielectric device 100B described above. The intermediate films may be formed by sputtering or the like. The intermediate films do not have to be formed by epitaxial growth.

The dielectric device 100D can be manufactured by forming the electroconductive oxide film 10 and intermediate film 9 in this order, before formation of each of the electrode films 4, 8 in the process of the dielectric device 100B described above. The electroconductive oxide films 10 can be formed by sputtering or the like. The electroconductive oxide films do not have to be formed by epitaxial growth.

In this dielectric device 100A, since substrate heating and low-rate sputtering are not essential conditions in the deposition of the electrode films 4, 8, the deposition time is remarkably reduced from the conventional time of 10 to 20 minutes per layer. Manufacturing cost of dielectric device is significantly improved by synergistic effect of the process throughput improvement and the reduction in material cost of the electrode films 4, 8.

Namely, since the dielectric devices of the present invention can be manufactured by the above-described methods, they have the effects as described below. Namely, since the dielectric film 3 can be epitaxially grown on the thin metal film 2, the dielectric film 3 is readily provided with high crystallinity. Furthermore, since the electrode films 4, 8 can be formed respectively above and below the dielectric film 3 thereafter, degrees of freedom increase for selection of the material of the two electrode films 4, 8 and a forming rate is increased considerably. Therefore, it becomes feasible to achieve improvement in reliability of the dielectric device and reduction of cost. The thin metal film 2 may or may not remain in the dielectric device eventually.

EXAMPLES (Example 1) Dielectric Device 100A

In a state in which an Si substrate 1 was heated at 400° C., a Pt film was epitaxially grown in the thickness of 50 nm on the surface orientation of the Si substrate 1 by sputtering to obtain a (100) preferentially oriented metal film 2 on the Si substrate 1. A growth rate of the Pt film was 0.2 nm/sec. Thereafter, in a state in which the Si substrate 1 was heated at 550° C., a potassium sodium niobate (KNN) film was epitaxially grown as dielectric film 3 in the thickness of 2000 nm on the metal film 2 by sputtering to obtain a (110) preferentially oriented dielectric film 3. Subsequently, at room temperature, an Ni film was deposited in the thickness of 200 nm on the dielectric film 3 by sputtering to obtain an amorphous electrode film 4. Thereafter, the electrode film 4 was bonded to an Si support substrate 5 by an epoxy resin layer 7. Thereafter, the Si substrate 1 was removed from the metal film 2 by an etching process based on RIE. Then an Ni film was formed in the thickness of 200 nm on the metal film 2 by sputtering at room temperature to obtain an amorphous electrode film 8. A deposition rate of the electrode film 8 was 2 nm/sec.

(Example 2) Dielectric Device 100B

A dielectric device 100B was obtained in the same manner as in Example 1, except that the metal film 2 was also etched in addition to the Si substrate 1 in the removal of the Si substrate 1.

(Example 3) Dielectric Device 100C

A dielectric device 100C was obtained in the same manner as in Example 2, except that intermediate films 9 of a non-oriented structure composed of Ti were provided in the thickness of 5 nm between the dielectric film 3 and the two electrode films 4, 8 by sputtering. The dielectric device 100C was improved in adhesion of the dielectric film 3 to the electrode film 4 and the electrode film 8.

(Example 4) Dielectric Device 100D

A dielectric device 100D was obtained in the same manner as in Example 3, except that electroconductive oxide films 10 of a non-oriented structure composed of $SrRuO_3$ were provided in the thickness of 20 nm respectively between the intermediate films 9 and the dielectric film 3 by sputtering. The present example suppressed the oxidation-reduction reaction between the intermediate films 9 and the dielectric film 3 while enhancing the adhesion between the electrode films 4, 8 and the dielectric film 3, thereby achieving high reliability of the device thanks to the chemical stability of the dielectric film 3.

(Example 5) Dielectric Device 100A'

A dielectric device 100A' was obtained in the same manner as in Example 1, except that an $(Al)_{50}$—$(Cu)_{50}$ alloy was used as a material for the electrode films 4, 8.

(Comparative Example 1) Dielectric Device

Figure 4:
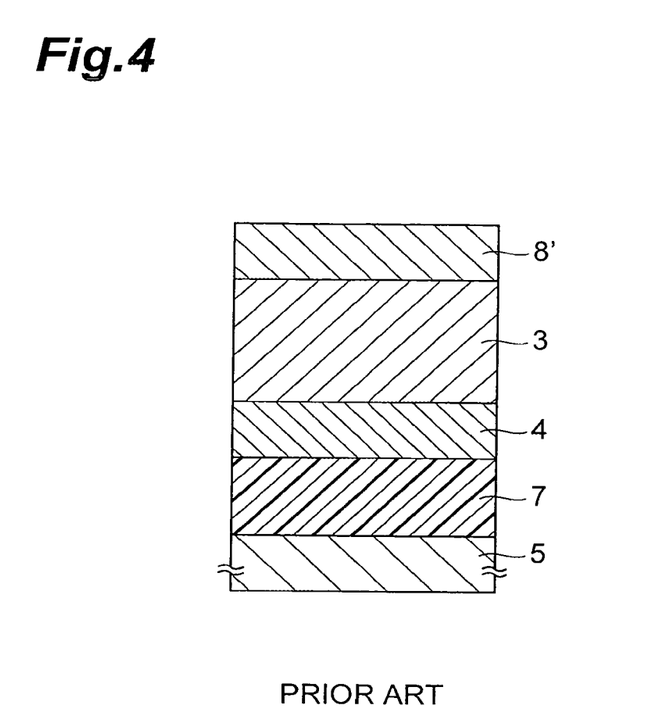
FIG. 4 is a schematic sectional view of a dielectric device in Comparative Example 1.

In a state in which an Si substrate 1 was heated at 400° C., a Pt film was epitaxially grown in the thickness of 200 nm on the surface orientation of the Si substrate 1 by sputtering to obtain a (100) preferentially oriented electrode film 8' on the Si substrate 1. A growth rate at this time was 0.2 nm/sec. Thereafter, in a state in which the Si substrate 1 was heated at 550° C., a potassium sodium niobate (KNN) film was epitaxially grown as dielectric film 3 in the thickness of 2000 nm on the electrode film 8' by sputtering to obtain a (110) preferentially oriented dielectric film 3. Subsequently, at room temperature, a Pt film was deposited in the thickness of 200 nm on the dielectric film 3 by sputtering to obtain a non-oriented electrode film 4. Thereafter, the electrode film 4 was bonded to an Si support substrate 5 by an epoxy resin layer 7. Thereafter, the Si substrate 1 was removed from the electrode film 8' by an etching process based on RIE. The configuration of the resultant device is shown in FIG. 4.

A comparison was made between the crystallinities of the dielectric films in the dielectric devices of Example 1 and Comparative Example 1. The measurement was conducted by X-ray diffractometry, using a diffractometer ATX-E of Rigaku Corporation as a measuring device and the Out-of-Plane method as a measuring method. Percentages of the peak intensity of (110) orientation to the overall peak intensity were measured under this condition; the percentage in Example 1 was found to be 92% and the percentage in Comparative Example 1 was found to be 61%.

In the dielectric devices of Example 1 and Comparative Example 1, the deposition times of the electrode film 8 and the electrode film 8' were one minute and forty seconds and about seventeen minutes, respectively.

Other Experimental Examples

With change in film thickness of the metal film 2 deposited on the single-crystal Si substrate, the orientation of the dielectric film 3 deposited thereon was measured every time by X-ray diffractometry (XRD) with the aforementioned diffractometer. The epitaxial metal film 2 was formed by DC sputtering under the conditions of surface orientation of single-crystal Si substrate 1: (100), composition of metal film 2: Pt (2-200 nm) film, substrate temperature during deposition: 400° C., gas pressure: 0.10 Pa, and input power 150 W. The deposition rate was 0.2 nm/sec.

The dielectric film 3 was formed on the metal film 2 by DC sputtering under the conditions of composition of dielectric film 3: potassium sodium niobate, substrate temperature: 550° C., gas pressure: 0.15 Pa, and input power: 700 W. The film thickness was 2000 nm. For each of samples in which the films up to the dielectric film 3 were deposited, a percentage of the peak intensity ascribed to (110), which is the preferential orientation of the dielectric, to the overall peak intensity was measured by X-ray diffractometry. The measurement result is shown in FIG. 5. As shown in FIG. 5, the dielectric film demonstrated high crystallinity in the range in which the thickness of the metal film 2 was from 20 nm to 70 nm.

What is claimed is:

1. A method of manufacturing a dielectric device comprising:
   epitaxially growing a metal film on a substrate;
   forming a dielectric film on the metal film such that the dielectric film has a preferentially oriented structure;
   forming a first electrode film having a non-oriented or amorphous structure on the dielectric film;
   removing the substrate and the metal film from the dielectric film; and
   forming a second electrode film having a non-oriented or amorphous structure on the dielectric film;
   wherein the dielectric device comprises the first electrode film, the dielectric film provided on the first electrode film, and the second electrode film provided on the dielectric film.

2. The method according to claim 1, wherein the dielectric film is (001), (101), or (110) preferentially oriented.

3. The method according to claim 1, wherein the dielectric film is a piezoelectric material.

4. The method according to claim 1, wherein an oxidation-reduction potential of every metal element forming the first electrode film and the second electrode film is higher than an oxidation-reduction potential of every metal element forming the dielectric film.

5. The method according to claim 1, wherein the first electrode film and the second electrode film independently comprise an element selected from the group consisting of Al, Ti, Zr, Ta, Cr, Co, and Ni.

6. The method according to claim 1, wherein the first electrode film and the second electrode film independently comprise an alloy containing at least one element selected from the group consisting of Al, Ti, Zr, Ta, Cr, Co, and Ni.

7. The method according to claim 1, wherein one principal surface of the dielectric film is in contact with the first electrode film and the other principal surface of the dielectric film is in contact with the second electrode film.

8. The method according to claim 1, further comprising forming an intermediate film comprising an element selected from the group consisting of Al, Ti, Zr, Ta, Cr, Co, and Ni on the dielectric film before forming at least one of the first electrode film and the second electrode film such that the intermediate film is disposed between the dielectric film and the at least one of the first electrode film and the second electrode film.

9. The method according to claim 8, wherein the intermediate film is in contact with the dielectric film and the at least one of the first electrode film and the second electrode film.

10. The method according to claim 8, further comprising forming an electroconductive oxide film on the dielectric film such that the electroconductive oxide film is disposed between the dielectric film and the at least one of the first electrode film and the second electrode film.

11. The method according to claim 10, wherein the intermediate film or the electroconductive oxide film is in contact with the dielectric film.

12. The method according to claim 1, wherein the first electrode film and the second electrode film have a thickness within a range of from 100 nm to 200 nm.

13. The method according to claim 1, wherein the dielectric film is a film such that in X-ray diffraction measurement, an intensity of a peak ascribed to a certain crystal lattice plane is not less than 50% of a total of intensities of all peaks.

14. The method according to claim 1, wherein the dielectric film is a film such that in X-ray diffraction measurement, an intensity of a peak ascribed to a certain crystal lattice plane is not less than 80% of a total of intensities of all peaks.

15. The method according to claim 1, wherein the first electrode film and the second electrode film are films such that in X-ray diffraction measurement, an intensity of a peak ascribed to any crystal lattice plane is less than 50% of a total of intensities of all peaks.

16. The method according to claim 1, wherein the first electrode film and the second electrode film are films such that in X-ray diffraction measurement, an intensity of a peak ascribed to any crystal lattice plane is not more than 10% of a total of intensities of all peaks.

17. The method according to claim 1, wherein the second electrode film is formed on the dielectric film after the substrate and metal film have been removed from the dielectric film.

18. A method of manufacturing a dielectric device comprising:
   epitaxially growing a metal film having a preferentially oriented structure on a substrate;
   forming a dielectric film on the metal film such that the dielectric film has a preferentially oriented structure;
   forming a first electrode film having a non-oriented or amorphous structure on the dielectric film;
   removing the substrate from the metal film; and
   forming a second electrode film having a non-oriented or amorphous structure on the metal film;
   wherein the dielectric device comprises the first electrode film, the dielectric film provided on the first electrode film, the second electrode film provided on the dielectric film, and the metal film between the second electrode film and the dielectric film.

19. The method according to claim 18, wherein the dielectric film is (001), (101), or (110) preferentially oriented.

* * * * *